United States Patent [19]

Kusunoki

[11] Patent Number: 5,471,656
[45] Date of Patent: Nov. 28, 1995

[54] COMMUNICATION APPARATUS UTILIZING HIGH POWER AMPLIFIER

[75] Inventor: Shigeo Kusunoki, Kanagawa, Japan

[73] Assignee: Sony Corporation, Tokyo, Japan

[21] Appl. No.: 368,768

[22] Filed: Jan. 4, 1995

Related U.S. Application Data

[63] Continuation of Ser. No. 231,689, Apr. 25, 1994, abandoned.

[30] Foreign Application Priority Data

Apr. 28, 1993 [JP] Japan .................... 5-103214

[51] Int. Cl.⁶ .................................. H04B 1/04
[52] U.S. Cl. ........................... 455/127; 330/136
[58] Field of Search .................. 455/127, 38.3, 455/89, 126; 330/295, 310, 133, 136, 134, 261, 273, 277

[56] References Cited

U.S. PATENT DOCUMENTS

| | | | |
|---|---|---|---|
| 4,456,889 | 6/1984 | Kumar | 330/133 |
| 4,574,248 | 3/1986 | Snodgrass | 330/136 |
| 4,686,387 | 8/1987 | Rumelhard | 330/296 |
| 5,083,096 | 1/1992 | Miyazaki | 330/133 |
| 5,087,836 | 2/1992 | Taylor | 307/450 |
| 5,164,679 | 11/1992 | Dittmer | 330/296 |
| 5,179,353 | 1/1993 | Miyake | 455/126 |
| 5,216,379 | 6/1993 | Hamley | 330/134 |
| 5,220,290 | 6/1993 | Black | 330/133 |
| 5,235,289 | 8/1993 | Kunitomo | 455/127 |
| 5,278,997 | 1/1994 | Martin | 330/133 |

FOREIGN PATENT DOCUMENTS

| | | |
|---|---|---|
| 0516134 | 12/1992 | European Pat. Off. . |
| 0481741 | 3/1993 | European Pat. Off. . |

OTHER PUBLICATIONS

EPO search report and annex Patent Abstracts of Japan; Apr. 6, 1992.

Primary Examiner—Reinhard J. Eisenzopf
Assistant Examiner—Mary M. Lin
Attorney, Agent, or Firm—Ronald P. Kananen

[57] ABSTRACT

A communication apparatus is small in power consumption and suitable for use in a portable radio communication apparatus. The communication apparatus includes a semiconductor power amplifier integrated circuit which uses a GaAs junction type FET having a gate bias terminal to which a gate bias voltage is applied. The integrated circuit decreases its amount of power consumption in a manner that the integrated circuit is operated to perform an amplification operation during a communication operation and not operated when a communication is interrupted or a time slot is not allotted to the communication apparatus itself. A detector detects a portion of a high-frequency signal to the amplifier circuit to provide an input to a gate bias generator which provides an input to an adder circuit, the output of which controls the bias on the power amplifier.

12 Claims, 2 Drawing Sheets

COMMUNICATION APPARATUS UTILIZING HIGH POWER AMPLIFIER

This application is a continuation of application Ser. No. 08/231,689 filed Apr. 25, 1994, now abandoned.

BACKGROUND OF THE INVENTION

1. Field of the Invention

The present invention generally relates to communication apparatus and, more particularly, is directed to a communication apparatus using a power amplifier of a low-power consumption type.

2. Description of the Prior Art

Recently, in land mobile communication such as a mobile telephone, a portable telephone or the like, the present radio frequency band allocated to the land mobile communication becomes insufficient for radio communication due to increase of subscribers. Then, various new services for the land mobile communication have been decided to be started. These new services are common in that they are each performed by digital communication of the time-division multiplex system using a quasi-microwave band of 0.8 GHz to 2 GHz.

Terminal devices for such a land mobile communication are indispensably required to be miniaturized since portability is a main feature of the devices. Then, integration of electronic parts used in the device has become a most important problem. Further, since the terminal device must be necessarily driven by a battery, it is an important condition to decrease a power source current of the device in order to make a non-charging time period for the battery longer.

Of the power source currents, an amount of current consumed by a power amplifier integrated circuit at a transmission stage is quite larger when compared with the consumed currents at the other portions of the terminal device. Therefore, it has been an important problem to decrease an amount of the current consumed by the power amplifier integrated circuit.

The conventional mobile communication terminal device of such a type is constructed as shown in FIG. 1, for example. The apparatus shown in FIG. 1 is an example of the mobile communication terminal device which is used in the time-division multiplex communication system.

Referring to FIG. 1, a relay 2 is connected between a power source terminal of a power amplifier 4 and one electrode of a power source 3, the other electrode of which is grounded at 5. Since the time-division multiplex system is employed, the relay 2 intermittently makes and breaks the connection between the power source 3, and the power amplifier 4 in accordance with a control signal from a main controller 1. Therefore, the power amplifier 4 of the terminal device is operated only during a time slot which is allotted to the terminal device itself, so that an amount of power source current consumed by the power amplifier 4 is decreased.

However, this conventional mobile communication terminal device has the following two serious defects.

The first defect is that the power source voltage of the power amplifier 4 is intermittently on and off. In this case, since many capacitors are inserted in the power source terminal of the power amplifier 4, it is impossible to turn on and off the power source voltage at a high speed, and so the power amplifier 4 is made on and off during the time slots adjacent its own time slot, respectively. However, since much power source current which is not effective to the power amplifier 4 continues to flow therethrough during the adjacent time slots, there arises a serious defect that the power source current can not be saved.

The second defect is that power consumed by the power amplifier 4 of the terminal device during its own time slot is constant regardless of an amount of the transmission power. An average transmission power is small in such a system as the portable telephone in which transmission power is always changed. However, since the power consumed by the power amplifier 4 is always constant, an average efficiency of the terminal device is degraded. As a consequence, there arises a serious defect that an amount of power source current consumed uselessly increases.

OBJECTS AND SUMMARY OF THE INVENTION

It is an object of the present invention to provide an improved communication apparatus in which the aforementioned shortcomings and disadvantages encountered with the prior art can be eliminated.

More specifically, it is an object of the present invention to provide a communication apparatus which can reduce an amount of power consumed uselessly.

As an aspect of the present invention, a communication apparatus is proposed which is comprised of a semiconductor power amplifier integrated circuit using a junction type field effect transistor having an input terminal to which a high-frequency signal supplied from a main controller is input and a gate bias terminal to which a gate bias voltage is applied, a detector for extracting a part of the high-frequency signal supplied from the main controller and performing a DC detection of the extracted high-frequency signal thereby to output a DC voltage, a bias generator for inputting thereto the DC voltage from the detector thereto and converting the input DC voltage into a voltage to thereby generate a gate bias voltage, and an adder having a first input terminal for inputting thereto a control signal voltage supplied from the main controller and a second input terminal for inputting thereto the bias voltage, for obtaining a sum of the input control signal voltage and the input bias voltage to thereby apply the sum to a gate bias terminal of the semiconductor power amplifier integrated circuit.

According to the communication apparatus of the present invention, since the gate bias voltage is controlled in accordance with the detected signal of the high-frequency signal, an amount of power consumption can be decreased during a period that a portable telephone is not used such as a period where a communication is interrupted or the like.

Further, according to the communication apparatus of the present invention, since the power amplifier is controlled not to operate during a time slot which is not allotted to the communication apparatus itself, an amount of power consumption can also be decreased.

The preceding and other objects, features, and advantages of the present invention will become apparent from the following detailed description of illustrative embodiments thereof when read in conjunction with the accompanying drawings.

DETAILED DESCRIPTION OF THE PREFERRED EMBODIMENTS

Embodiments of the communication apparatus according to the present invention will now be described with reference to FIGS. 2 and 3.

Figure 1:
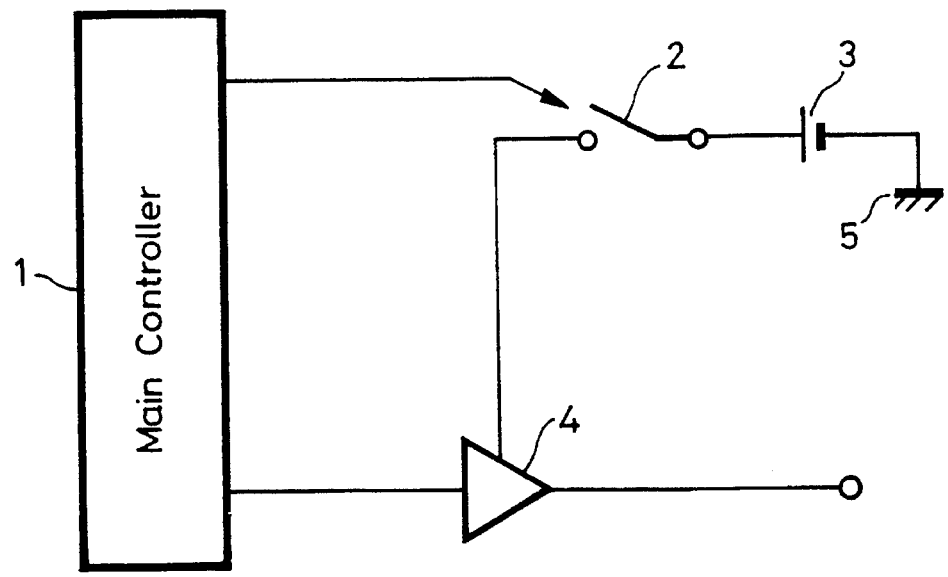
FIG. 1 is a block diagram showing an arrangement of a main part of a transmission stage of a conventional communication apparatus.
Figure 2:
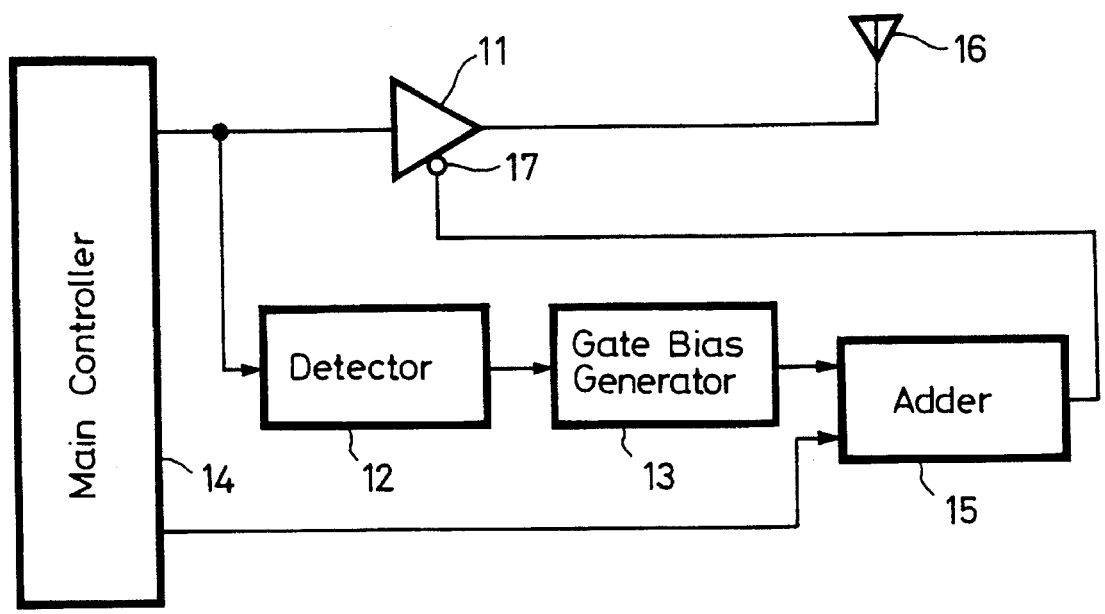
FIG. 2 is a block diagram showing an arrangement of a first embodiment of a transmission stage of a communication apparatus according to the present invention.

FIG. 2 is a diagram used to explain the first embodiment of the communication apparatus according to the present invention and shows an arrangement of a transmission portion of the time-division multiplex communication system.

Figure 3:
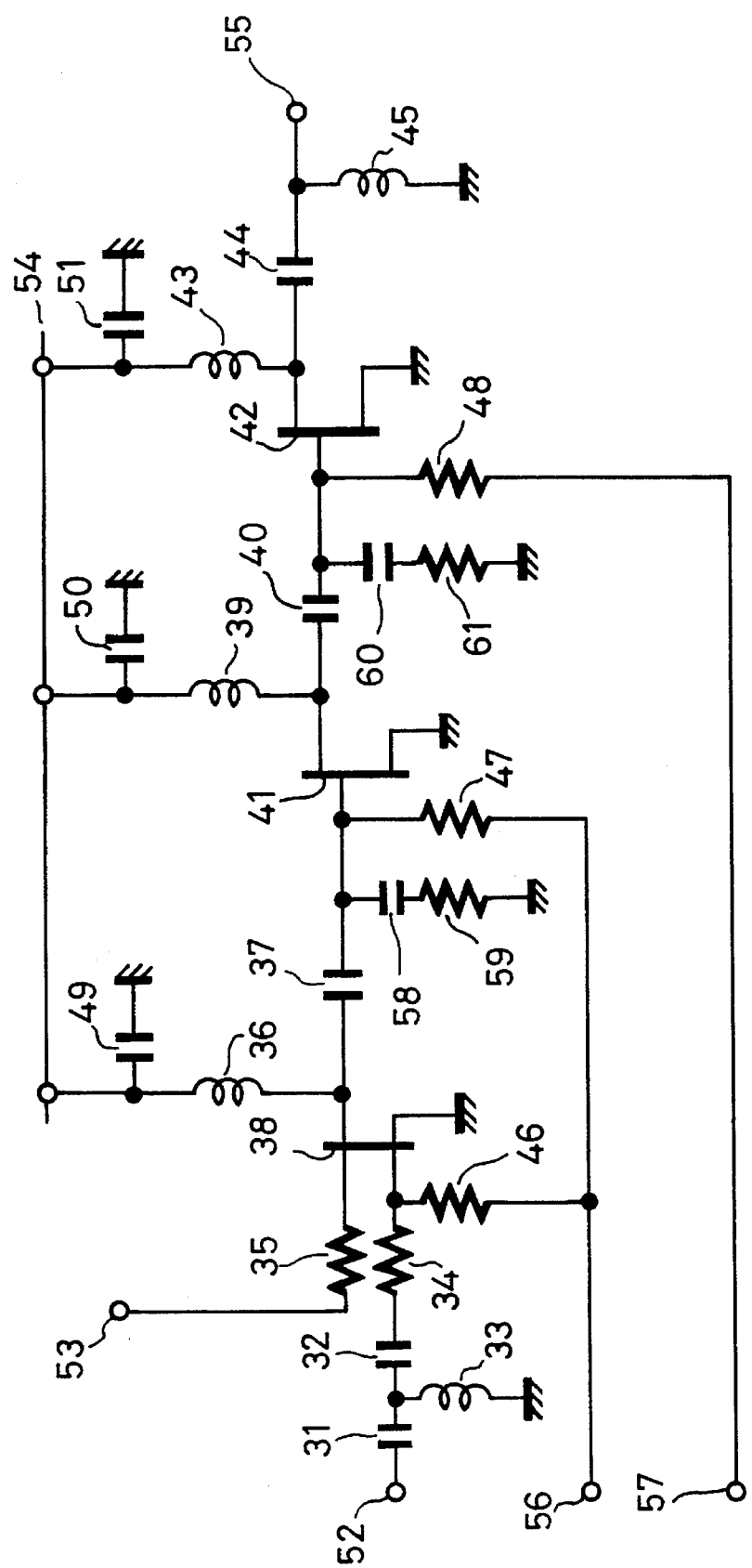
FIG. 3 is a circuit diagram showing an arrangement of a second embodiment of an example of a semiconductor power amplifier integrated circuit according to the present invention and used in the communication apparatus shown in FIG. 2.

A power amplifier 11 used in the first embodiment is constructed like the semiconductor power amplifier integrated circuit according to the second embodiment shown in FIG. 3, for example. The semiconductor power amplifier integrated circuit is constituted in the following manner. That is, as shown in FIG. 3, junction type gallium arsenic field effect transistors (GaAs JFETs) (hereinafter simply referred to as JFETs) 38, 41 and 42 are connected in a multi-stage fashion to form an amplifier circuit. This amplifier circuit is connected to a positive power source to be operated thereby.

Coupling capacitors 37 and 40 are provided between the adjacent amplifier stages to couple the adjacent amplifier stages so that the respective amplifier stages are independently operated in terms of DC components. Further, phase adjusting and impedance matching circuits which are respectively formed of capacitors and resistors 58, 59 and 60, 61 are provided between the adjacent amplifier stages so as to adjust a phase of a signal to thereby prevent the oscillation.

With this arrangement, the amplifier circuit can operate stably even if amplitudes of the JFETs of the respective amplifier stages are increased, so that the number of the amplifier stages can be decreased by increasing the amplitude for one stage of the amplifier. As a consequence, the semiconductor power amplifier integrated circuit can be miniaturized and a power consumed by the integrated circuit can be decreased.

Further, the semiconductor power amplifier integrated circuit is provided with an input impedance matching circuit formed of elements 31 to 34 at the rear stage of an input terminal 52, and an output impedance matching circuit formed of elements 43 to 45 at the preceeding stage of an output terminal 55 so as to facilitate the connection with other circuits.

A power source connection terminal 54 to the respective amplifier states is provided with bypass capacitors 49 to 51 between the former and the latter so as to eliminate an influence due to stray capacitances of leading wires, thereby facilitating the connection with the power source and mass production of the integrated circuit.

The amplifier 38 of the primary stage employs a dual gate junction type GaAs FET. A voltage applied to the second electrode of the GaAs FET 38 is controlled through a resistor 35 by an external driving control terminal 53 so that the gain of the power amplifier according to the present invention is controlled.

An amplifier 41 of the next stage is formed of a single gate junction GaS FET 41 whose gate is controlled in gain from a first gate bias terminal 56 through a resistor 47. The drain of the FET 41 is connected through a load resistor 36 to a power supply 54. Further, the gate of the JFET 42 which finally forms a controller is also controlled in gain by varying a bias from an external control terminal 57 through a resistor.

A gate bias terminal for determining the operating points of the JFETs at the respective amplifier stages is provided so that the operating points can be controlled from the outside of the amplifier stages. A plurality of or first and second gate bias terminals 56 and 57 are provided to be connected to the gates of FETs 38 and 41 through resistors 46 and 47 as shown in FIG. 3 so that the respective amplifier stages can be controlled in such a manner that the amplifier of the primary stage is operated as a class A amplifier with a good linearity and the amplifier of the rear stage is operated as a class AB amplifier which is less in power consumption.

Turning back to FIG. 2, operation of the transmission portion will be described below. A high-frequency signal is supplied to the semiconductor power amplifier integrated circuit (hereinafter referred to as a power amplifier) 11 from a main controller 14. The high-frequency signal is amplified by the power amplifier 11 and then supplied to a transmission antenna 16.

A part of the high-frequency signal delivered from the main controller 14 is supplied to a detector 12, which in turn performs a DC detection of the high-frequency signal and outputs a DC voltage which is applied to a gate bias generator 13. The gate bias generator 13 generates a gate bias voltage in accordance with the DC voltage.

The gate bias voltage is applied to a first input terminal of an adder 15. The adder 15 receives a control signal voltage from the main controller 14 at its second input terminal, thereby obtaining a sum of the gate bias voltage and the control signal voltage to output the sum voltage.

An output terminal of the adder 15 is connected to a gate bias terminal 17 of the power amplifier 11.

Operation of the thus constituted transmission portion of the communication apparatus according to the embodiment will be described.

The high-frequency signal from the main controller 14 is input to the power amplifier 11 and the detector 12. The power amplifier 11 amplifies the input high-frequency signal and sends the amplified high-frequency signal to the transmission antenna 16 connected at the rear stage thereof.

The detector 12 performs the DC detection of the input high-frequency signal to generate the DC voltage. The DC voltage is input to the gate bias generator 13, which in turn converts the DC voltage into a voltage and applies the converted voltage to the first input of the adder 15.

The voltage of the control signal applied to the second input of the adder 15 from the main controller 14 is at a high level during a time slot which is allotted to the communication apparatus itself, so that in this case the gate bias voltage appearing at the output terminal of the adder 15 has fallen in the operation range of the power amplifier 11.

At this time, when a power of the high-frequency signal from the main controller 14 is small, the DC voltage which is an output from the bias generator 13 becomes low. Accordingly, the gate bias voltage applied to the power amplifier 11 becomes also low to thereby decrease a power source current flowing through the power amplifier 11.

In contrast, when a power of the high-frequency signal from the main controller 14 is large, the DC voltage output from the bias generator 13 becomes high. Accordingly, the gate bias voltage applied to the power amplifier 11 becomes also high to thereby increase a power source current flowing through the power amplifier 11.

As a consequence, the degradation of efficiency of the power amplifier can be prevented because the power source current of the power amplifier 11 becomes small when a transmission output is small.

During a time slot allotted to the communication apparatus other than itself, since the voltage of the control signal voltage from the main controller 14 is set to be lower than a pinch-off voltage of the GaAs JFETs used in the power amplifier 11, the gate bias voltage applied to the gate bias terminal 17 of the power amplifier 11 from the adder 15 is low. Therefore, the JFET of the power amplifier 11 is set in an off state. Accordingly, the power source current flowing through the power amplifier 11 becomes zero.

As described above, according to the communication apparatus of the present invention, since the power amplifier is operated during the transmission operation but not operated when no transmission is carried out, an amount of power consumption can be decreased.

Further, since the power amplifier according to the present invention can control an amount of the power source current flowing therethrough in accordance with an amount of the transmission power even in the signal transmission, the power amplifier can always be used at a high efficiency state.

Furthermore, in the time-division multiplex system, since the power amplifier can be turned on and off by changing a voltage applied to its gate bias terminal, the power amplifier can be switched at a high speed. Therefore, the present invention is advantageous in that the power source current which is not effective to the power amplifier is not required to flow therethrough during the adjacent time slots.

The aforesaid advantages will be remarkable when the semiconductor power amplifier integrated circuit according to the present invention is used in a portable telephone.

Having described the preferred embodiments of the invention with reference to the accompanying drawings, it is to be understood that the invention is not limited to those precise embodiments and that various changes and modifications thereof could be effected therein by one skilled in the art without departing from the spirit or scope of the novel concepts of the invention as defined in the appended claims.

What is claimed is:

1. A communication apparatus comprising:

a semiconductor power amplifier integrated circuit using a junction type field effect transistor having an input terminal to which a high-frequency input signal having a variable magnitude is supplied from a main controller and a gate bias terminal to which a gate bias voltage is applied;

a detector for extracting a part of said variable magnitude high-frequency input signal supplied from said main controller and performing a direct current (DC) detection of the extracted high-frequency signal to thereby output a variable DC voltage having a variable magnitude corresponding to the magnitude of said input signal;

a gate bias generator for inputting thereto the variable DC voltage output from said detector and converting the variable DC voltage to thereby generate a variable gate bias voltage which varies in accordance with said variable DC voltage; and an adder having a first input terminal to which a control signal voltage is applied from said main controller and a second input terminal to which said variable gate bias voltage is applied for obtaining a sum of the input control signal voltage and the variable input gate bias voltage thereby to apply the sum to said gate bias terminal of said semiconductor power amplifier integrated circuit.

2. A communication apparatus according to claim 1, wherein said semiconductor power amplifier integrated circuit includes a multi-stage amplifier having junction type field effect transistors, and bias voltages applied to gate bias terminals of said junction type field effect transistors are set from outside of the multi-stage amplifier.

3. A communication apparatus according to claim 2, wherein said bias voltages applied to said gate bias terminals cause operation of an amplifier of a front stage of said multi-stage amplifier as a class A amplifier and an amplifier at a rear stage of said multi-stage amplifier as a class AB amplifier.

4. A communication apparatus according to claim 1, wherein said semiconductor power amplifier integrated circuit includes a gallium-arsenide (GaAs) field effect transistor.

5. A communication apparatus comprising:

a semiconductor power amplifier integrated circuit with a junction type field effect transistor having an input terminal and a gate bias terminal to which a gate bias voltage is applied for controlling current flowing through said power amplifier circuit;

a main controller providing both a high-frequency variable input signal having a variable magnitude to said input terminal of said power amplifier circuit and a control signal voltage;

a detector for extracting a part of said high-frequency variable input signal supplied from said main controller and performing a direct current (DC) detection of the extracted high-frequency signal to thereby output a variable DC voltage related to the magnitude of said variable high-frequency signal;

a gate bias generator for receiving the variable DC voltage output from said detector and converting the variable DC voltage thereby to generate a variable gate bias voltage which varies in magnitude in accordance with the variable DC voltage; and an adder having a first input terminal to which said control signal voltage is applied from said main controller and a second input terminal to which said variable gate bias voltage is applied for obtaining a sum of the input control signal voltage and the input gate bias variable voltage, thereby to apply the sum to said gate bias terminal of said semiconductor power amplifier integrated circuit, whereby when power of the high-frequency signal is small, the gate bias voltage applied to the power amplifier circuit is low, and vice versa.

6. A communication apparatus according to claim 5, wherein said semiconductor power amplifier integrated circuit includes a multi-stage amplifier having junction type field effect transistors, and variable bias voltages applied to gate bias terminals of said junction type field effect transistors are set from outside said power amplifier integrated circuit.

7. A communication apparatus according to claim 6, wherein said variable bias voltages applied to said gate bias terminals of said transistors cause an amplifier of a front stage of said multi-stage amplifier to operate as a class A amplifier and an amplifier at a rear stage of said multi-stage amplifier to operate as a class A amplifier.

8. A communication apparatus according to claim 5, wherein said semiconductor power amplifier integrated circuit includes a gallium-arsenide (GaAs) field effect transistor.

9. A communication apparatus according to claim 1 wherein, during a time slot allotted to the communication apparatus other than itself, the voltage of the control signal voltage from the main controller is set to be lower than a pinch-off voltage of the junction type field effect transistors used in the power amplifier circuit, the variable gate bias voltage applied to the gate bias terminal of the power amplifier circuit from the adder is low, so that the junction field effect transistor of the power amplifier is set in an off state so that power source current flowing in the power amplifier circuit becomes zero.

10. A communication apparatus according to claim 5 wherein, during a time slot allotted to the communication apparatus other than itself, the voltage of the control signal voltage from the main controller is set to be lower than a pinch-off voltage of the junction type field effect transistors used in the power amplifier circuit, the variable gate bias voltage applied to the gate bias terminal of the power of the power amplifier circuit from the adder is low, so that the junction field effect transistor of the power amplifier is set in an off state so that power source current flowing in the power amplifier circuit becomes zero.

11. A communication apparatus according to claim 1, further including an antenna connected to an output of said power amplifier.

12. A communication apparatus according to claim 5, further including an antenna connected to an output of said power amplifier.

* * * * *